United States Patent [19]
Hartke et al.

[11] Patent Number: 5,969,579
[45] Date of Patent: Oct. 19, 1999

[54] ECL PULSE AMPLITUDE MODULATED ENCODER DRIVER CIRCUIT

[75] Inventors: David Hartke, Durango, Colo.; Joseph T. DiBene, II, Oceanside, Calif.

[73] Assignee: NCR Corporation, Dayton, Calif.

[21] Appl. No.: 08/949,641

[22] Filed: Oct. 17, 1997

[51] Int. Cl.[6] ..................................................... H03K 7/02
[52] U.S. Cl. ........................... 332/116; 326/126; 375/353; 375/286
[58] Field of Search ............................. 326/126; 332/116, 332/115; 375/353, 286

[56] References Cited

U.S. PATENT DOCUMENTS 5,488,412  1/1996  Majeti et al. ............................. 348/10
5,515,377  5/1996  Horne et al. ............................. 370/395

*Primary Examiner*—Arnold Kinkead

[57] ABSTRACT

A Pulse Amplitude Modulation (PAM) generator that generates multilevel PAM signals at frequencies over 1 GHz is disclosed. The PAM generator uses Emitter Coupled Logic (ECL) technology that implements differential pair current switches such that the outputs are summed to produce precisely balanced PAM signals.

8 Claims, 4 Drawing Sheets

FIG. 2

| VIN+ (A) | VIN- (B) | IQ1 | IQ2 | IQ5 | IQ3 | IQ4 | IQ6 | IQ17 | IQ18 | IR1 | IR2 | A+ (Q) | A- ($\bar{Q}$) |
|---|---|---|---|---|---|---|---|---|---|---|---|---|---|
| H | L | 0 | 0 | 0 | 0 | IC4 | IC6 | IC17 | 0 | IC4 | IC17 | HL | LH |
| L | L | 0 | 0 | 0 | IC3 | 0 | IC6 | IC17 | 0 | 0 | IC2+IC3+IC17 | HH | LL |
| H | H | IC1 | 0 | IC5 | 0 | 0 | 0 | 0 | IC18 | IC1+IC4+IC18 | 0 | LL | HH |
| L | H | 0 | IC2 | IC5 | 0 | 0 | 0 | 0 | IC18 | IC18 | IC2 | LH | HL |

ECL PULSE AMPLITUDE MODULATED ENCODER DRIVER CIRCUIT

BACKGROUND OF THE INVENTION

1. Field of the Invention

This invention relates in general to a pulse amplitude modulation generator, and, more specifically, to an Emitter Coupled Logic (ECL) pulse amplitude modulator that generates multilevel signals at high frequencies.

2. Description of Related Art

Pulse Amplitude Modulation (PAM) signals are used to transmit information and control logic systems throughout the world. However, PAM signals at high frequencies are difficult to generate because the speed and bandwidth required to generate multi-level pulses are typically difficult to produce with present electronics systems.

The problem of generating PAM signals is compounded when Emitter Coupled Logic (ECL) outputs are desired. Further, the use of ECL that has accurate complimentary time and amplitude characteristics makes the generation of PAM ECL signals even more difficult.

It can be seen, then, that there is a need for PAM signals at high frequencies. It can also be seen that there is a need for PAM signals that are compatible with ECL. It can also be seen then that there is a need for PAM signals that are compatible with ECL that have accurate complimentary time and amplitude characteristics.

SUMMARY OF THE INVENTION

To overcome the limitations in the prior art described above, and to overcome other limitations that will become apparent upon reading and understanding the present specification, the present invention discloses a method and apparatus for generating PAM signals at high frequencies that are compatible with ECL output levels. Further, the invention forms ECL outputs with accurate complimentary time and amplitude characteristics.

The present invention solves the above-described problems by generating the PAM levels directly within the ECL circuitry. By generating the levels directly, complimentary signal characteristics are inherent in the output signals of the device.

A system in accordance with the principles of the present invention includes four differential pairs of transistors and two output transistors. The first and second differential pairs act as inputs to a first logic signal, and the third and fourth differential pairs are inputs to the second logic signal. The emitters of the first pair are coupled to a first collector of the third pair, and the emitters of the second pair are coupled to a second collector of the third pair. A first collector in the first pair and a first collector in the second pair are coupled to a collector in the fourth pair and a base of a first output transistor, and a second collector in the first pair and a second collector in the second pair are coupled to another collector in the fourth pair and a base of a second output transistor.

One aspect of the present invention is that the ECL technology directly generates the PAM levels.

Another aspect of the present invention is that the ECL outputs of the system are generated by summing various other logical connections of the two logic inputs.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout:

FIG. 2 shows a logic state table for the present invention;

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a method and apparatus for generating PAM signals at high (greater than 1 gigahertz) frequencies by forming the PAM levels directly within the ECL circuitry.

Figure 1:
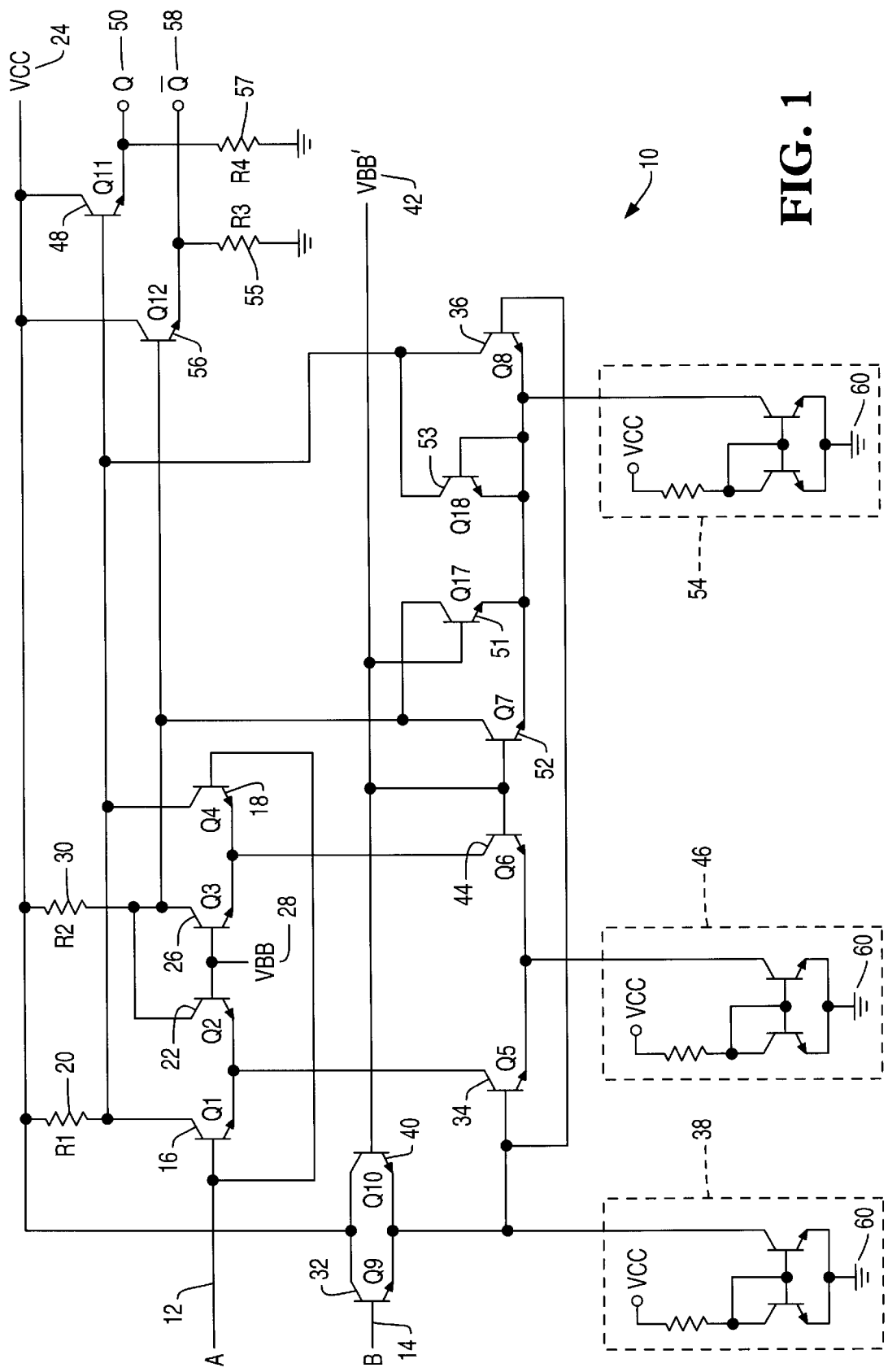
FIG. 1 illustrates a circuit in accordance with the present invention.

FIG. 1 illustrates a circuit 10 in accordance with the present invention.

Logic Input A

Circuit 10 is an Emitter Coupled Logic (ECL) circuit with two inputs, input A 12 and input B 14. Input A 12 and input B 14 are independent single-ended +5 Volt PECL inputs. The two inputs swing around a bias voltage over an 800 millivolt voltage that is ECL compatible.

Input A 12 is coupled to the base of transistor Q1 16 and to the base of transistor Q4 18. The collector of transistor Q1 16 is coupled to resistor R1 20 and to the collector of transistor Q4 18. The emitter of transistor Q1 16 is coupled to the emitter of transistor Q2 22. The other end of resistor R1 20 is coupled to voltage Vcc 24, and the collector of transistor Q2 22 is coupled to the collector of transistor Q3 26. Voltage Vcc 24 is typically 5 Volts.

The base of transistor Q2 22 is coupled to the base of transistor Q3 26, and to voltage Vbb 28. Voltage Vbb 28 is typically 3.7 Volts.

The collector of transistor Q3 26 is coupled to resistor R2 30. The collector of transistor Q4 18 and the other end of resistor R2 30 are coupled to voltage Vcc 24. The emitters of transistor Q3 26 and Q4 18 are coupled together.

Transistors Q1 16, Q2 22, Q3 26, and Q4 18 form two sets of differential amplifiers. The logic input A 12 is placed directly into the base of transistor Q1 16 and Q4 18. Thus, when logic input A 12 is high, current can flow through the transistors Q1 16 and Q4 18.

Logic Input B

AND Function

Logic input B 14 is coupled to the base of transistor Q9 32. The collector of transistor Q9 32 is coupled to voltage Vcc 24. The emitter of transistor Q9 24 is coupled to the base of transistor Q5 34, the base of transistor Q8 36, and to current source I1 38. Current source I1 38 is typically 3.0 milliamps. The value of current source I1 38 is critical to the operation of the circuit 10 when the circuit 10 is connected to transmission line lengths that cause signal attenuation, because there is difficulty distinguishing between different threshold levels with small voltage differences.

The collector of transistor Q9 32 is also coupled to the collector of transistor Q10 40. The emitter of transistor Q9 32 is coupled to the emitter of transistor Q10 40, and the base of transistor Q10 40 is coupled to voltage Vbb' 42. Voltage Vbb' 42 is typically 2.9 Volts.

Transistors Q5 34 and Q6 44 form yet another differential pair in circuit 10. The collector of transistor Q5 34 is coupled to the emitters of transistors Q1 16 and Q2 22, and the emitters of transistors Q5 34 and Q6 44 are coupled together, and commonly coupled to current source I2 46. Current source I2 46 is typically 3.5 milliamps. The collector of transistor Q6 44 is coupled to the emitters of transistors Q3 26 and Q4 18.

Current flows through transistor Q9 32 when logic input B 14 is high. When this occurs, current will be able to flow in transistor Q5 34 as well. However, the collector of transistor Q5 34 is coupled to the emitter of transistor Q1 16, and thus, for current to flow through both Q1 16 and Q5 34, both logic level A 12 and logic level B 14 must be high. Thus, any connection to the collector of transistor Q1 16 will only be high when both logic level A 12 and logic level B 14 are high.

The OR function and the Output Q

The base of output transistor Q11 48 is coupled to the collector of transistor Q1 16 and to the collector of transistor Q8 36. The collector of transistor Q11 48 is coupled to voltage Vcc 24, and the emitter of transistor Q11 48 is the output Q 50.

To determine the logic of the output Q 50, the logic of the tandem transistors Q1 16 and Q5 34 must be logically combined with the logic of the transistor Q8 36. As stated before, the tandem transistors Q1 16 and Q5 34 create a logical "AND" function, because both logic input A 12 and logic input B 14 must be high to make the output at the collector of transistor Q1 16 high. When the voltage level at the collector of transistor Q1 16 is high, no current flows in transistor Q11 48. Further, since the base of transistor Q11 48 is also coupled to the collector of transistor Q8 36, we must determine when current will flow in transistor Q8 36.

Current will flow in transistor Q8 36 when logic input B 14 is high, regardless of the state of logic input A 12.

Thus, output Q 50 can be defined as ((A AND B) OR B)$^{-1}$

The Output Q not

The base of transistor Q6 44 is coupled to the base of transistor Q7 52 and to voltage Vbb' 42. The emitter of transistor Q7 52 is coupled to the emitter of transistor Q8 36, the emitter of transistor Q17 51, the emitter of transistor Q18 53, and current source I3 54. Current source I3 54 is typically 11.5 milliamps.

Transistors Q17 51 and Q18 53 provide the majority of the current drive for the circuit 10. Transistors Q7 52 and Q8 36 are in parallel with transistors Q17 51 and Q18 53 respectively.

The collector of transistor Q7 52 is coupled to the collector of transistor Q3 36 and to the base of output transistor Q12 56. The collector of output transistor Q12 56 is coupled to voltage Vcc 24, and the emitter of transistor Q12 56 is the output Q not 58. Current sources I1 38, I2 46, and I3 54 are all connected to voltage Vee 60. Voltage Vee 60 is typically zero volts.

To determine the logic of output Q not 58, we must determine what will make current flow through transistor Q12 56. When current flows, output Q not 58 will be low, and when current does not flow, output Q not 58 will be high. To determine when current flows, we must see when the voltage at the base of transistor Q12 56 is low, which means current is flowing.

The base of transistor Q12 56 is low when current flows in transistor Q7 52 or in the tandem of transistors Q3 26 and Q6 44.

Current will flow in transistor Q7 52 when input B 14 is low (not B). Current will flow in transistor Q3 26 when logic input A 12 is low (not A) AND when logic input B is low to turn on transistor Q6 (not B).

Thus, output Q not 58 will be high when current does not flow in any of the above situations, which is given by:

Q not=((A not AND B not) OR B not)−1

To balance the circuit 10, resistors R3 55 and R4 57 are coupled to the collectors of transistors Q12 56 and Q11 48 respectively. These resistors provide the proper impedance match for the circuit 10. The values of resistors R3 55 and R4 57 are typically 270 ohms.

FIG. 2 shows a logic state table for the present invention.

Column 60 shows the state of input A 12, also known as Vin+. Column 62 shows the state of input B 14, also known as Vin−. As the states of input A 12 and input B 14 change, the logic in circuit 10 changes accordingly.

Column 64 shows the current through transistor Q1 16. As shown in column 64, current only flows through Q1 16 when input A 12 and Input B 14 are high, and the value of the current is the current at the collector of Q1 16 (shown as IC1).

Columns 66–82 show various other states within circuit 10. The currents listed in columns 80 and 82 are the currents for resistors R1 20 and R2 30, which are always complementary from state to state, providing a balanced switching level at the outputs for circuit 10. Columns 84 and 86 show the state outputs measured at output Q 50 (also knows as A+) and output Q not 58 (Also known as A−).

Figure 3:
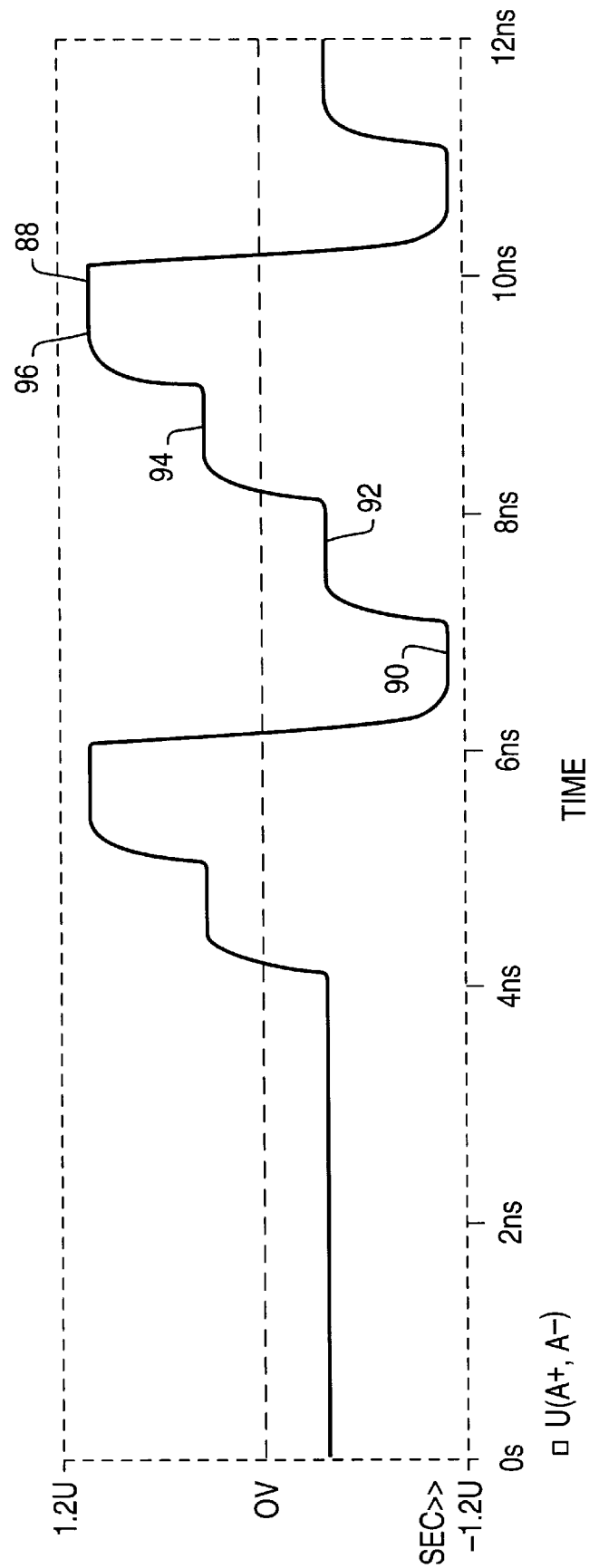
FIG. 3 shows the differential output from the circuit of the present invention.

FIG. 3 shows the differential output from the circuit of the present invention.

FIG. 3 shows waveform 88, which is the differential output (output Q 50 minus output Q not 58). The waveform 88 is shown at a 2 gigabit per second rate.

When input A 12 is high, and input B 14 is low, the waveform 88 is HL minus LH, shown at location 90.

When input A 12 is low, and input B 14 is low, the waveform 88 is HH minus LL, shown at location 92.

When input A 12 is high, and input B 14 is high, the waveform 88 is LL minus HH, shown at location 94.

When input A 12 is low, and input B 14 is high, the waveform 88 is LH minus HL, shown at location 96.

Figure 4:
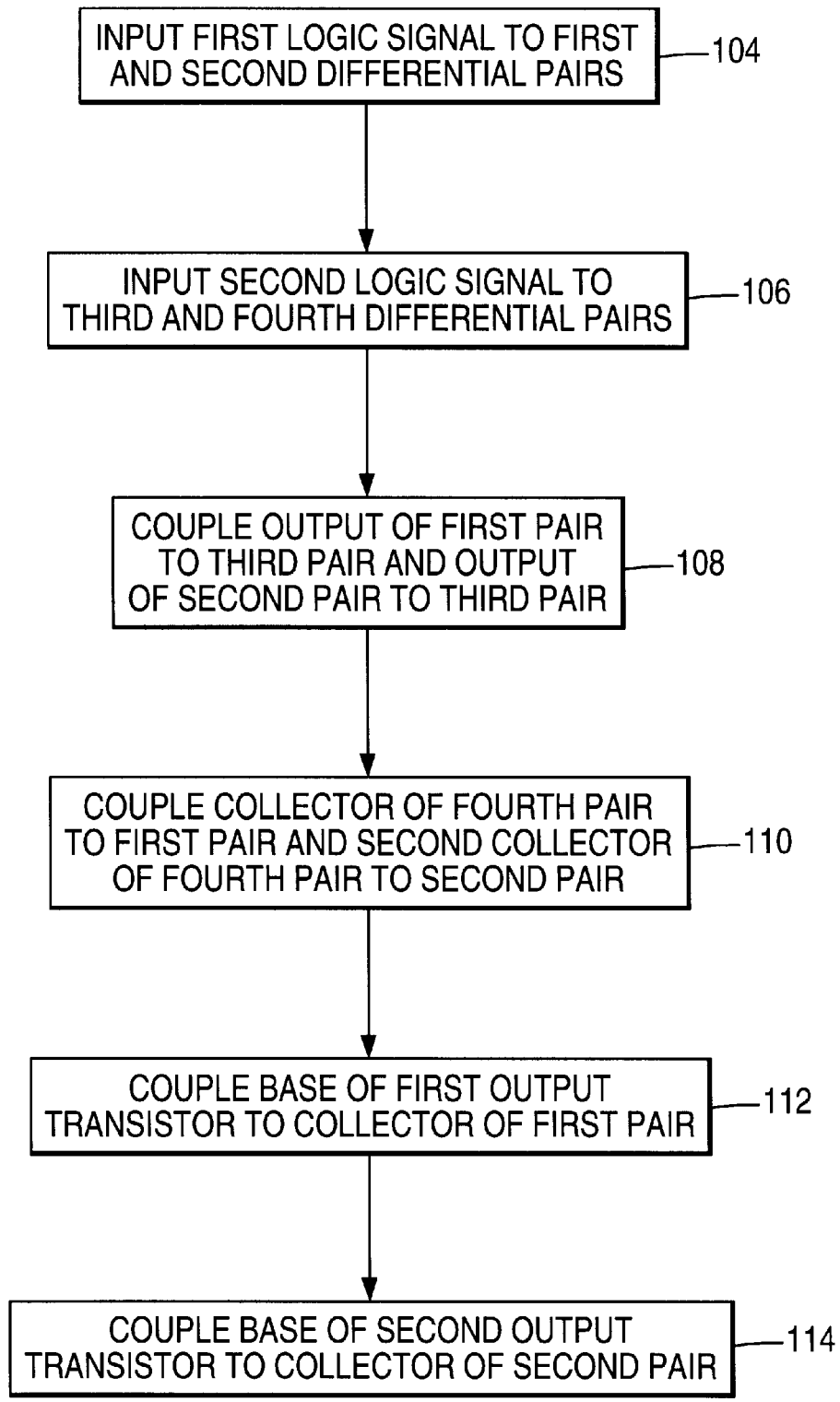
FIG. 4 is a flow chart illustrating the steps used in the present invention.

FIG. 4 is a flow chart illustrating the steps used in the present invention.

Block 104 represents the step of inputting a first logic signal into a first base of a first differential pair of transistors and a second base of a second differential pair of transistors.

Block 106 represents the step of inputting a second logic signal into a third base of a third differential pair of transistors and a fourth base of a fourth differential pair of transistors.

Block 108 represents the step of coupling the output of the first differential pair to a first collector of the third differential pair and the output of the second differential pair to a second collector of the third differential pair.

Block 110 represents the step of coupling a third collector of the fourth differential pair to a collector of the first differential pair, and a fourth collector of the fourth differential pair to a collector of the second differential pair.

Block 112 represents the step of coupling a base of a first output transistor to the collector of the first differential pair, whereby an output collector of the first output transistor is a first output of the device. Block 114 represents the step of coupling a base of a second output transistor to the collector of the second differential pair, whereby an output collector of the second output transistor is a second output of the device.

Conclusion

The aforementioned embodiment allows for the use of bipolar transistors. Other embodiments, including fieldeffect transistors, differential transmitter pairs, or other embodiments may be used to create current steering in which generation of the output waveform may be accomplished. Further, the invention can be used for different numbers of level generation, e.g., more than four, and can also be extended to other levels of pulse amplitude modulation as well.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method for generating multilevel pulse amplitude modulation signals, comprising the steps of:

inputting a first logic signal into a first base of a first differential pair of transistors and a first base of a second differential pair of transistors;

inputting a second logic signal into a first base of a third differential pair of transistors and a first base of a fourth differential pair of transistors;

coupling an output of the first differential pair to a first collector of the third differential pair and an output of the second differential pair to a second collector of the third differential pair;

coupling a first collector of the fourth differential pair to a first collector of the first differential pair and a first collector of the second differential pair, and a second collector of the fourth differential pair to a second collector of the first differential pair and a second collector of the second differential pair;

coupling a base of a first output transistor to the first collector of the first differential pair and the first collector of the second differential pair, wherein an emitter of the first output transistor is a first output providing a first multilevel pulse amplitude modulation signal; and coupling a base of a second output transistor to the second collector of the first differential pair and the second collector of the second differential pair; wherein an collector of the second output transistor is a second output providing a second multilevel pulse amplitude modulation signal.

2. The method of claim 1, wherein an emitter of the first output transistor is coupled to a first resistor, and an emitter of the second output transistor is coupled to a second resistor.

3. The method of claim 1, wherein the second logic signal is coupled to the first base of the third differential pair of transistors and the first base of the fourth differential pair of transistors through a fifth differential transistor pair.

4. The method of claim 1, wherein the fourth differential pair comprises two differential pairs in parallel.

5. An apparatus for producing multilevel pulse amplitude modulation signals, comprising:

a first differential transistor pair for receiving a first logic input;

a second differential transistor pair for receiving the first logic input, wherein the first differential transistor pair and the second differential transistor pair are coupled by a base of the first differential transistor pair and a base of the second differential transistor pair;

a third differential transistor pair for receiving a second logic input, a first collector of the third differential transistor pair coupled to an output of the first differential transistor pair, and a second collector of the third differential transistor pair coupled to an output of the second differential transistor pair;

a fourth differential transistor pair for receiving the second logic input, wherein the fourth differential transistor pair is coupled to the third differential transistor pair by a base of the third differential transistor pair and a base of the fourth differential transistor pair, a first collector of the fourth differential transistor pair being coupled to a collector of the first differential transistor pair, and a second collector of the fourth differential transistor pair being coupled to a collector of the second differential transistor pair;

a first output transistor, coupled to the collector of the first differential transistor pair and the first collector of the fourth differential transistor pair; and a second output transistor, coupled to the collector of the second differential transistor pair and the second collector of the fourth differential transistor pair.

6. The apparatus of claim 5, wherein an emitter of the first output transistor is coupled to a first resistor and an emitter of the second output transistor is coupled to a third resistor.

7. The apparatus of claim 5, wherein the second logic input is coupled to the third differential transistor pair and the fourth differential transistor pair through a fifth differential transistor pair.

8. The apparatus of claim 5, wherein the fourth differential pair comprises two differential pairs in parallel.

* * * * *